(12) United States Patent
Leobandung

(10) Patent No.: US 9,355,914 B1
(45) Date of Patent: May 31, 2016

(54) INTEGRATED CIRCUIT HAVING DUAL MATERIAL CMOS INTEGRATION AND METHOD TO FABRICATE SAME

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/745,999

(22) Filed: Jun. 22, 2015

(51) Int. Cl.
| | | |
|---|---|---|
| *H01L 27/12* | (2006.01) |
| *H01L 21/8238* | (2006.01) |
| *H01L 29/66* | (2006.01) |
| *H01L 21/84* | (2006.01) |
| *H01L 29/16* | (2006.01) |
| *H01L 29/04* | (2006.01) |
| *H01L 21/31* | (2006.01) |
| *H01L 21/3213* | (2006.01) |
| *H01L 21/306* | (2006.01) |

(Continued)

(52) U.S. Cl.
CPC .. *H01L 21/823807* (2013.01); *H01L 21/02538* (2013.01); *H01L 21/02603* (2013.01); *H01L 21/02636* (2013.01); *H01L 21/265* (2013.01); *H01L 21/283* (2013.01); *H01L 21/30604* (2013.01); *H01L 21/31* (2013.01); *H01L 21/31116* (2013.01); *H01L 21/324* (2013.01); *H01L 21/32133* (2013.01); *H01L 21/823814* (2013.01); *H01L 21/823821* (2013.01); *H01L 21/823864* (2013.01); *H01L 21/845* (2013.01); *H01L 27/0924* (2013.01); *H01L 27/1211* (2013.01); *H01L 29/04* (2013.01); *H01L 29/0649* (2013.01); *H01L 29/0673* (2013.01); *H01L 29/16* (2013.01); *H01L 29/201* (2013.01); *H01L 29/6656* (2013.01); *H01L 29/6681* (2013.01); *H01L 29/66545* (2013.01); *H01L 29/785* (2013.01)

(58) Field of Classification Search
CPC .................. H01L 21/02603; H01L 21/02636; H01L 21/283; H01L 21/31
USPC ........................................................ 257/351
See application file for complete search history.

(56) References Cited

U.S. PATENT DOCUMENTS

| | | | |
|---|---|---|---|
| 8,084,337 B2 | 12/2011 | Samuelson et al. | |
| 8,580,634 B1 * | 11/2013 | Xie ...................... | H01L 21/845 257/E21.635 |

(Continued)

FOREIGN PATENT DOCUMENTS

| | | |
|---|---|---|
| TW | 201347176 A | 11/2013 |
| WO | 2014209393 A1 | 12/2014 |

(Continued)

OTHER PUBLICATIONS

English Translation of TW 201347176A.

*Primary Examiner* — Luan C Thai
(74) *Attorney, Agent, or Firm* — Harrington & Smith; Louis J. PPercello

(57) ABSTRACT

In one aspect thereof the invention provides a structure that includes a substrate having a surface and a plurality of fins supported by the surface of the substrate. The plurality of fins are formed of Group IVA-based crystalline semiconductor material and are spaced apart and generally parallel to one another. In the structure at least some of the plurality of fins comprise an amorphous region forming a nanowire precursor structure that is located along a length of the fin where a Group III-V transistor is to be located. A method to fabricate the structure and other structures is also disclosed.

14 Claims, 13 Drawing Sheets

(51) Int. Cl.
*H01L 21/02* (2006.01)
*H01L 21/283* (2006.01)
*H01L 21/311* (2006.01)
*H01L 29/201* (2006.01)
*H01L 29/78* (2006.01)
*H01L 29/06* (2006.01)
*H01L 27/092* (2006.01)
*H01L 21/324* (2006.01)
*H01L 21/265* (2006.01)

(56) References Cited

U.S. PATENT DOCUMENTS

| | | | |
|---|---|---|---|
| 8,859,355 | B1 | 10/2014 | Leobandung |
| 8,900,941 | B2 * | 12/2014 | Cai .................. H01L 29/66795 257/E21.409 |
| 9,219,153 | B2 * | 12/2015 | Xie ....................... H01L 29/785 |
| 2011/0315988 | A1 | 12/2011 | Yu et al. |
| 2014/0327045 | A1 | 11/2014 | Leobandung |
| 2014/0329376 | A1 | 11/2014 | Sanchez et al. |
| 2015/0021681 | A1 | 1/2015 | Hou |
| 2015/0064854 | A1 * | 3/2015 | Leobandung ....... H01L 27/1211 438/157 |
| 2015/0069473 | A1 * | 3/2015 | Glass ................ H01L 21/02175 257/288 |
| 2015/0076620 | A1 | 3/2015 | Waldron et al. |
| 2015/0340438 | A1 * | 11/2015 | Zhu .................. H01L 29/78648 257/77 |

FOREIGN PATENT DOCUMENTS

| | | |
|---|---|---|
| WO | 2015047244 A1 | 4/2015 |
| WO | 2015047300 A1 | 4/2015 |
| WO | 2015047341 A1 | 4/2015 |

* cited by examiner

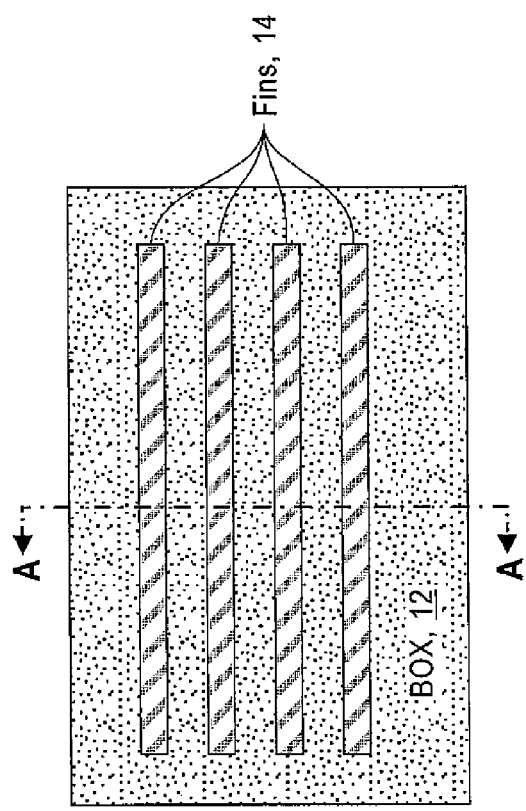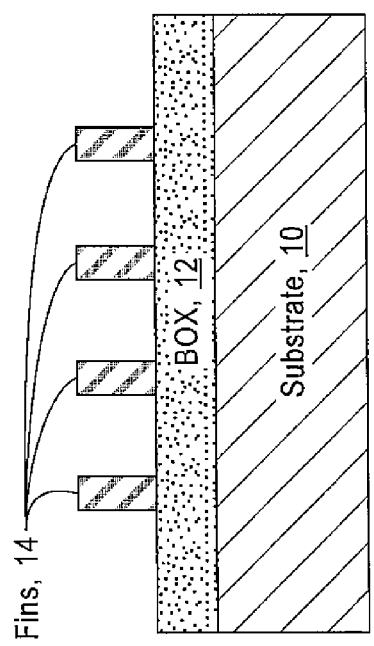

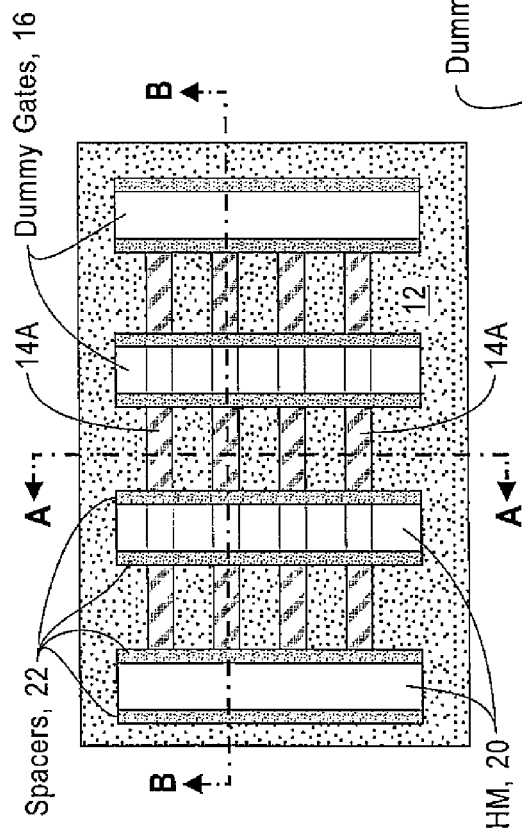
FIG. 2
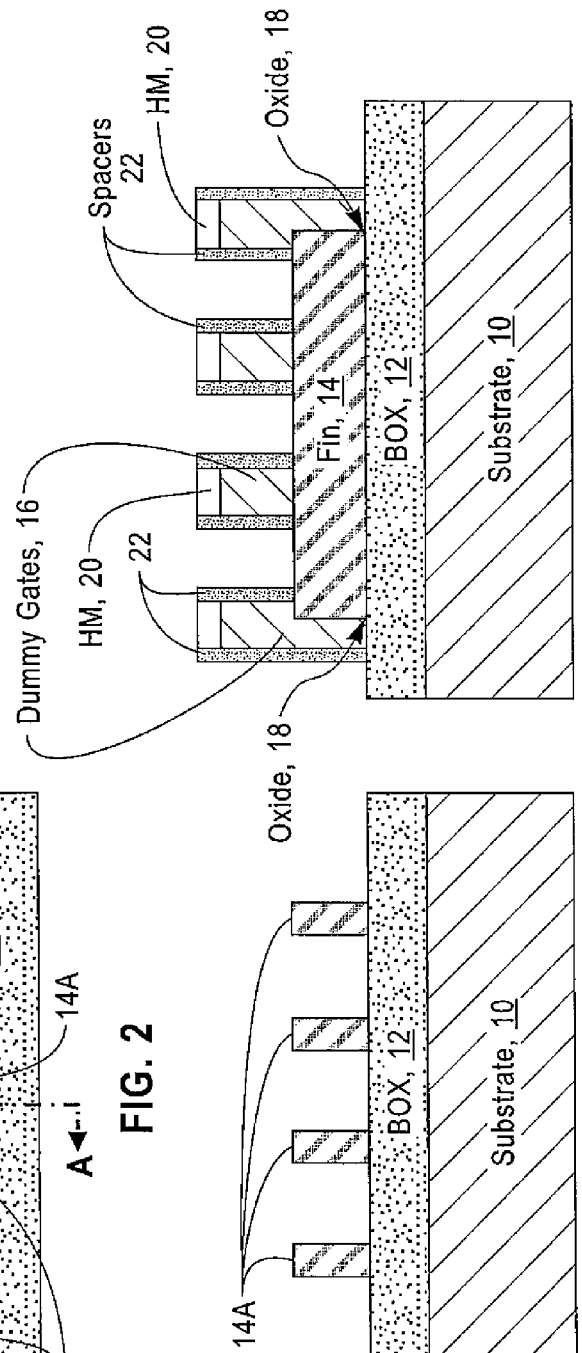
FIG. 2A
FIG. 2B

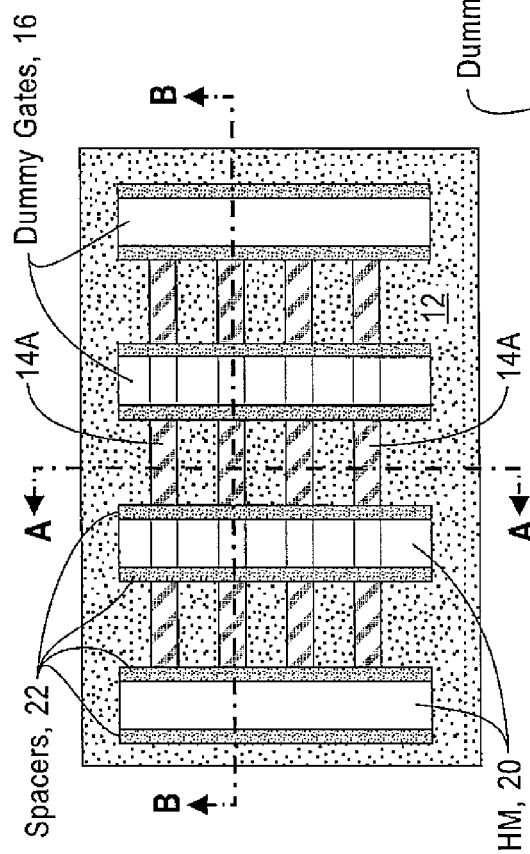
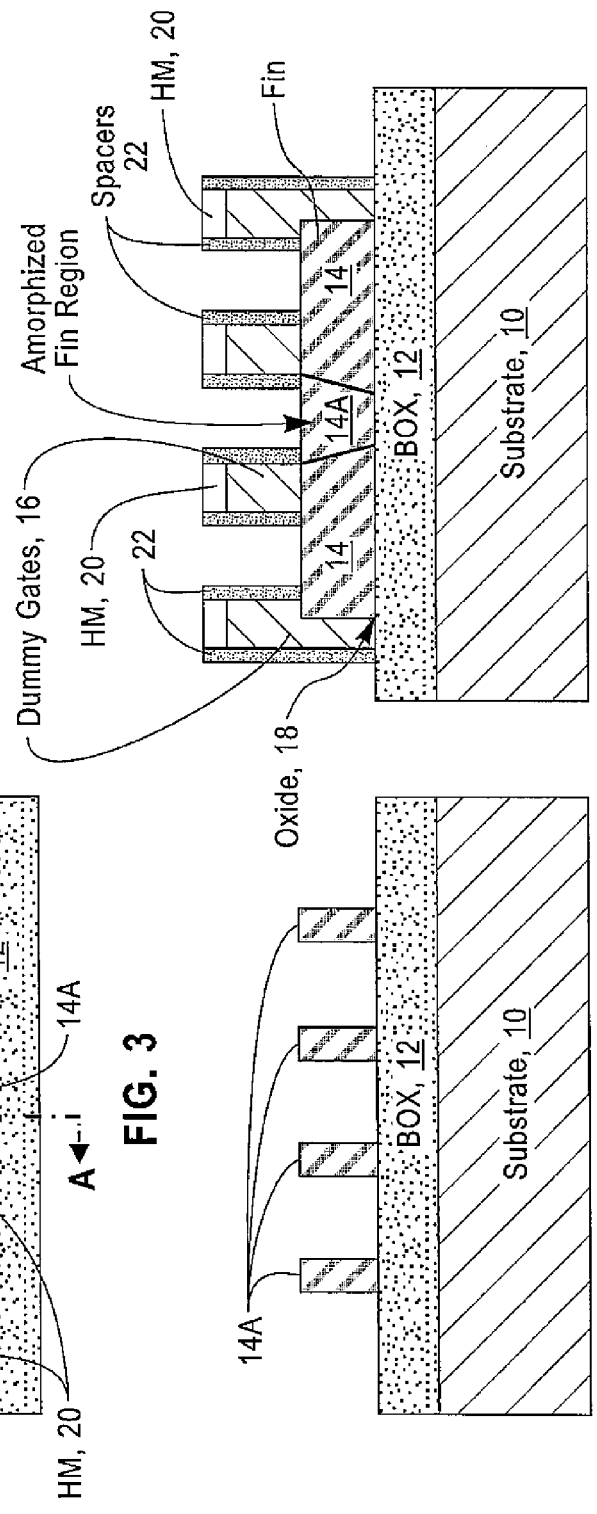
FIG. 3
FIG. 3A
FIG. 3B

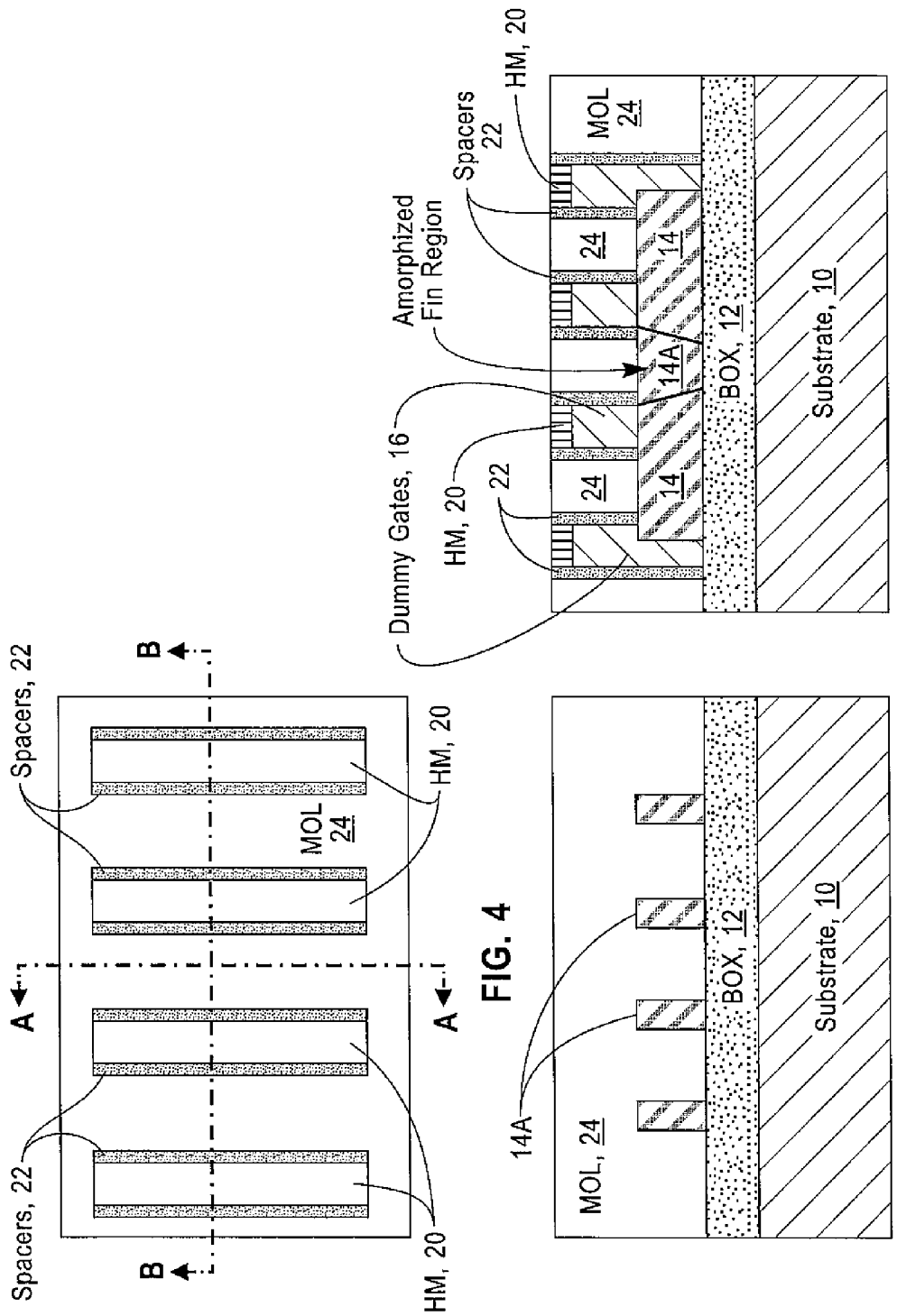

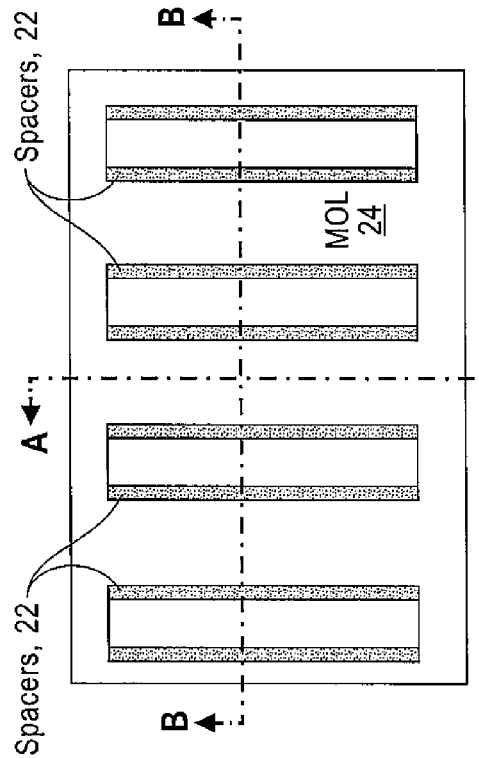
FIG. 5
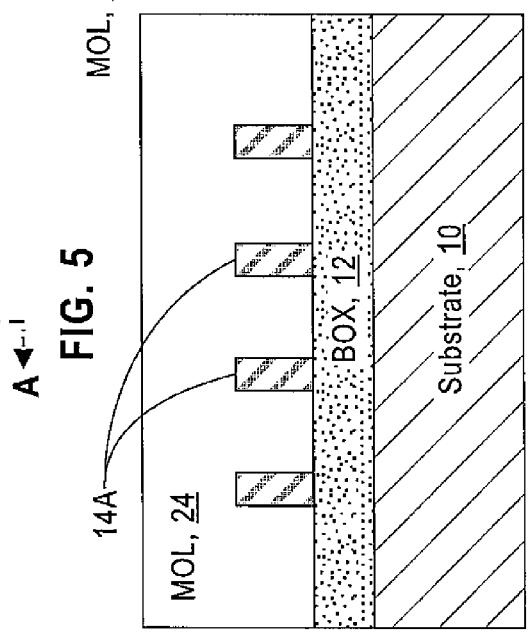
FIG. 5A
FIG. 5B

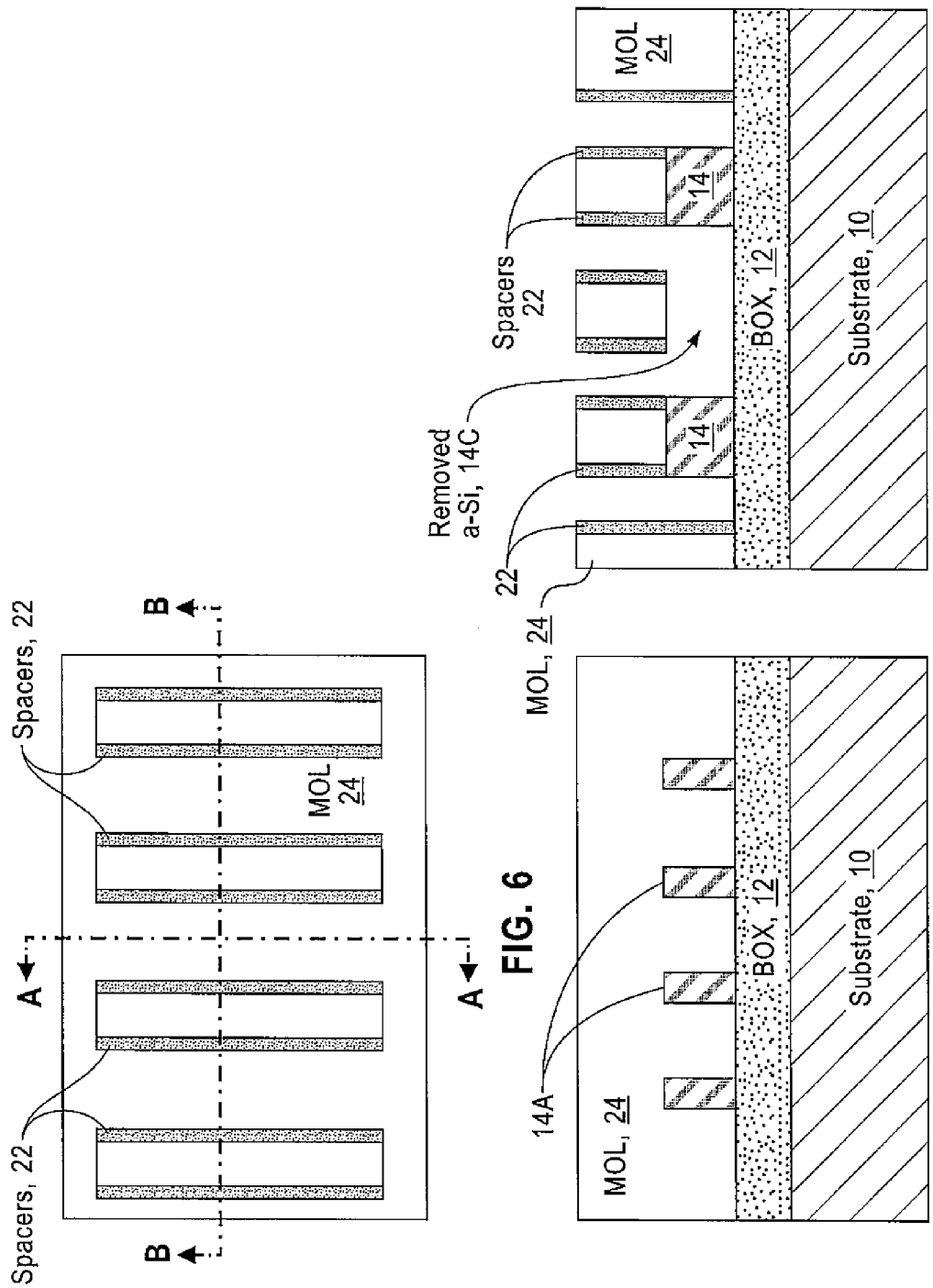

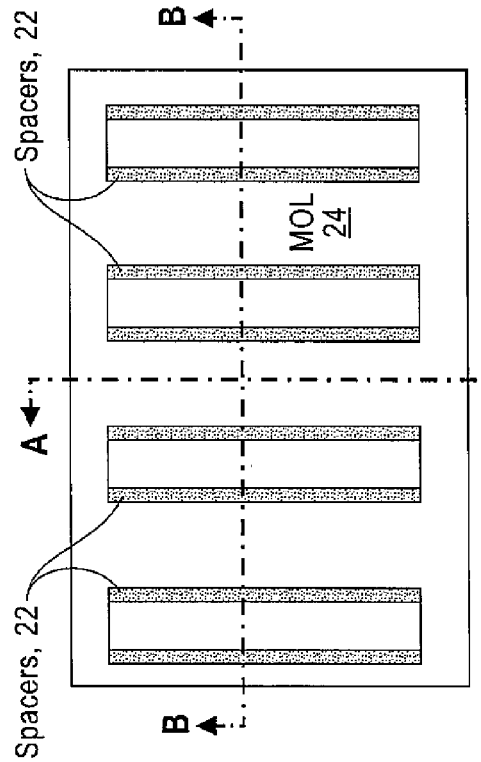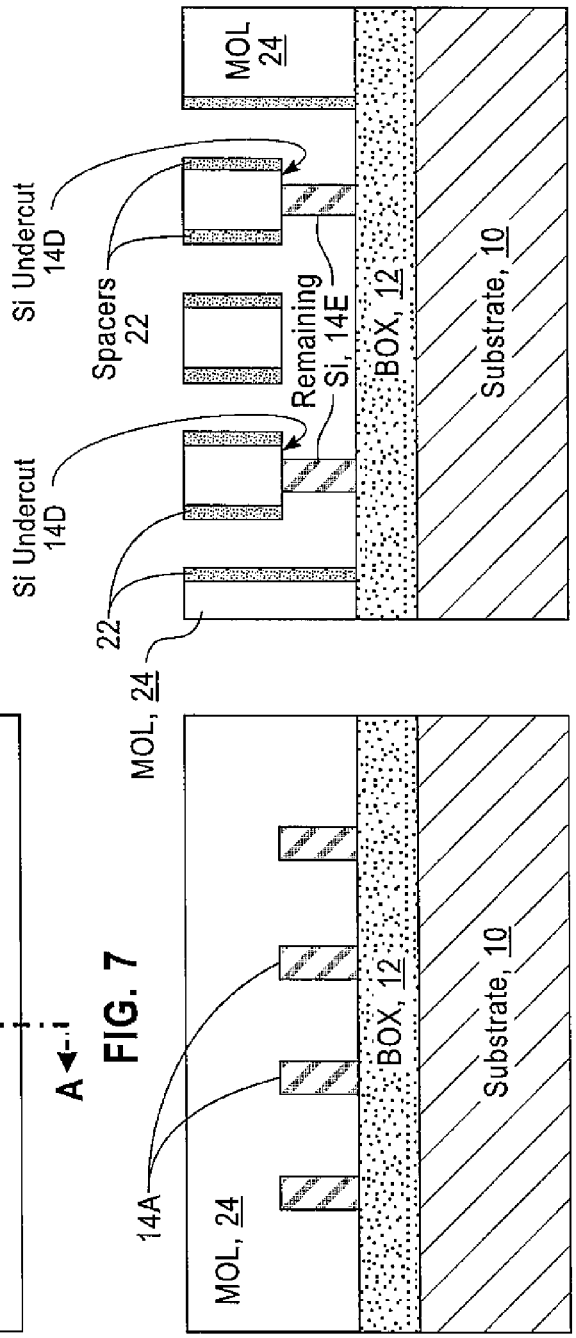

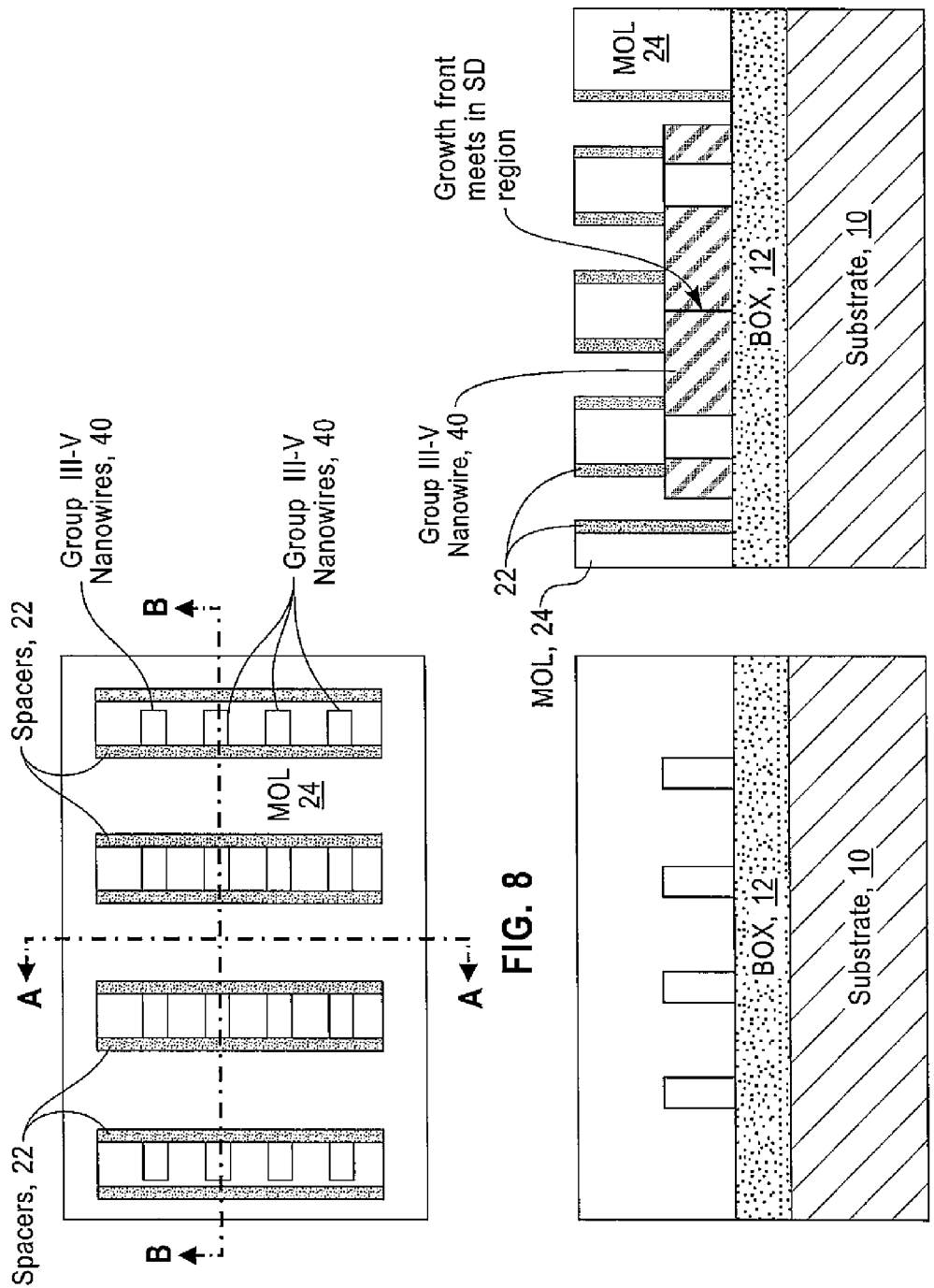

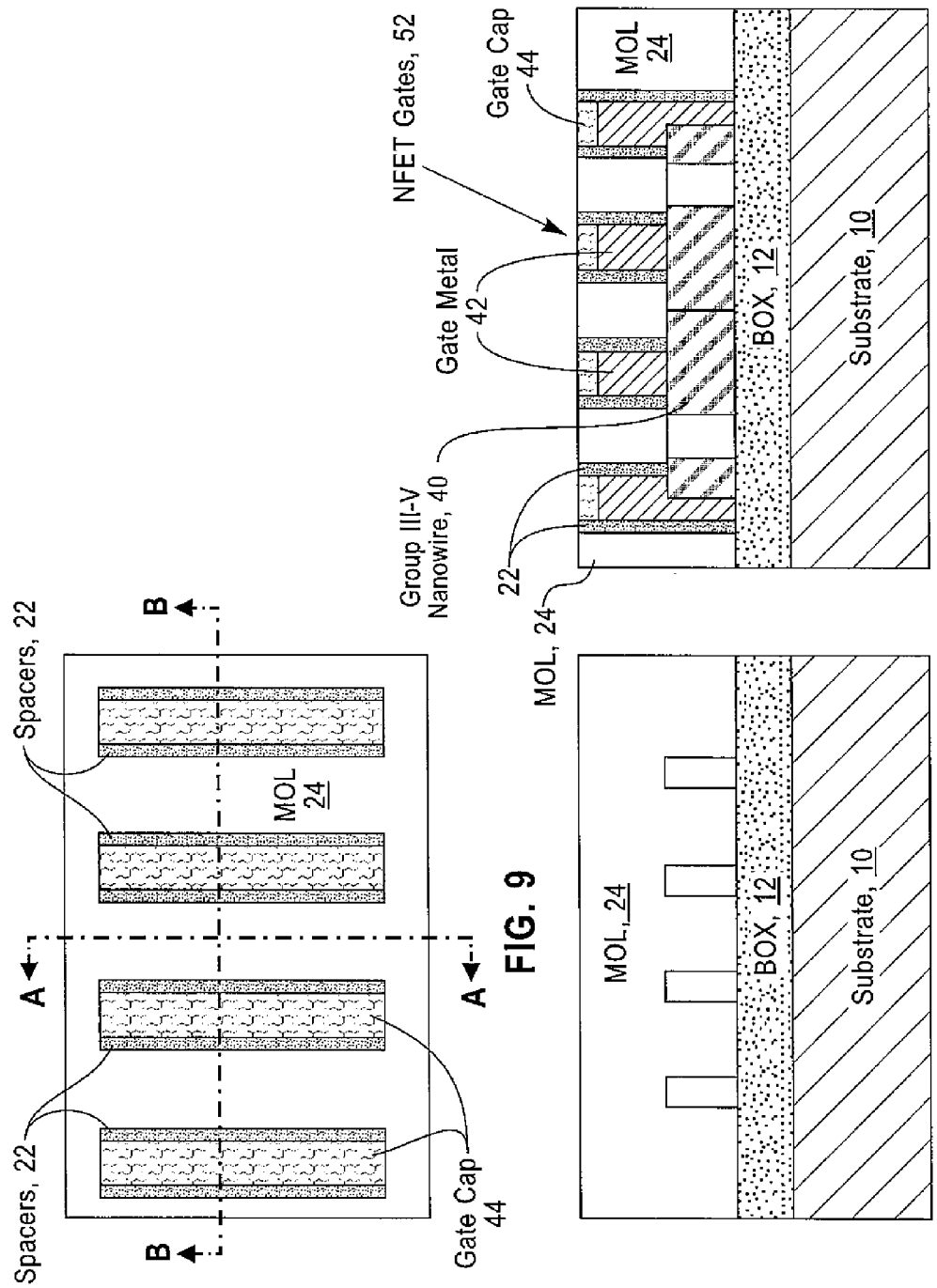

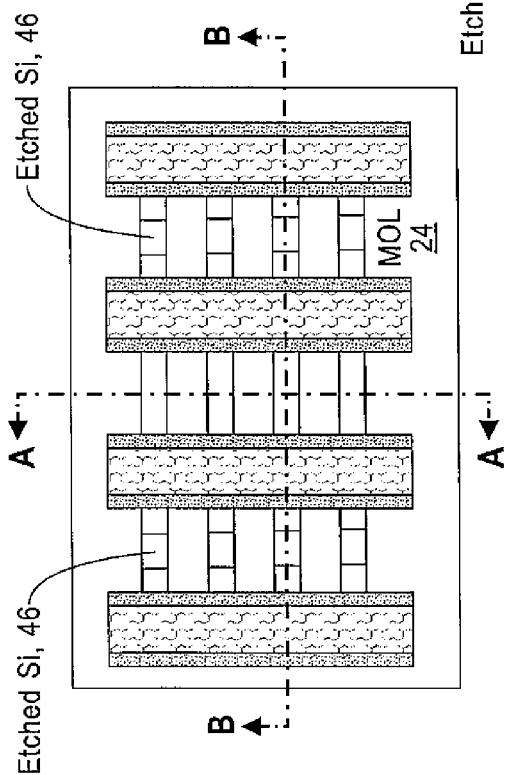
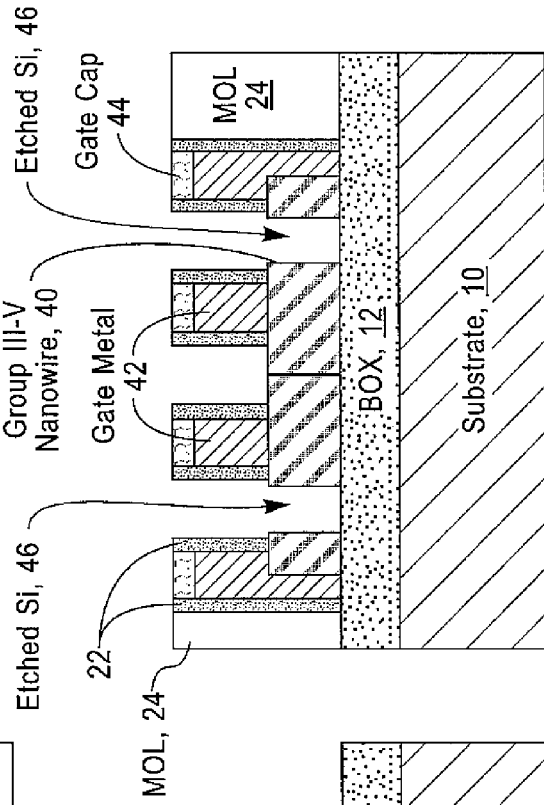
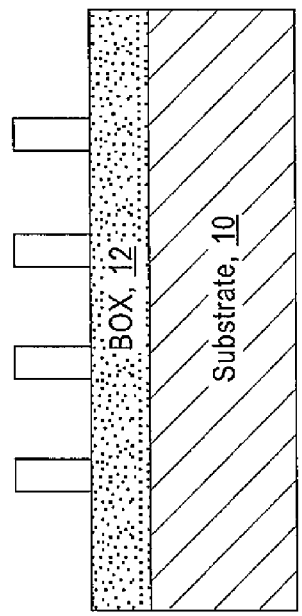
FIG. 10
FIG. 10A
FIG. 10B

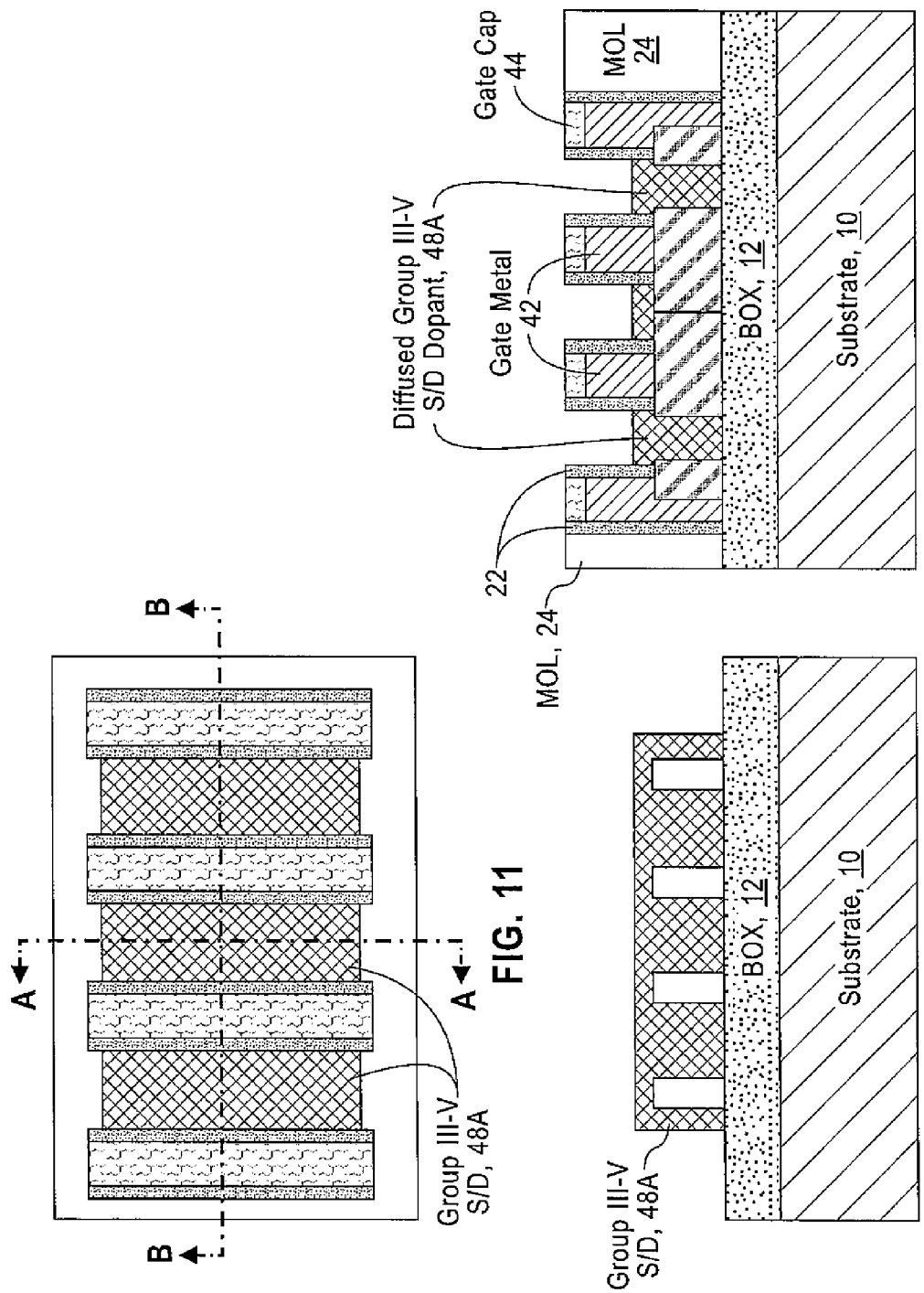

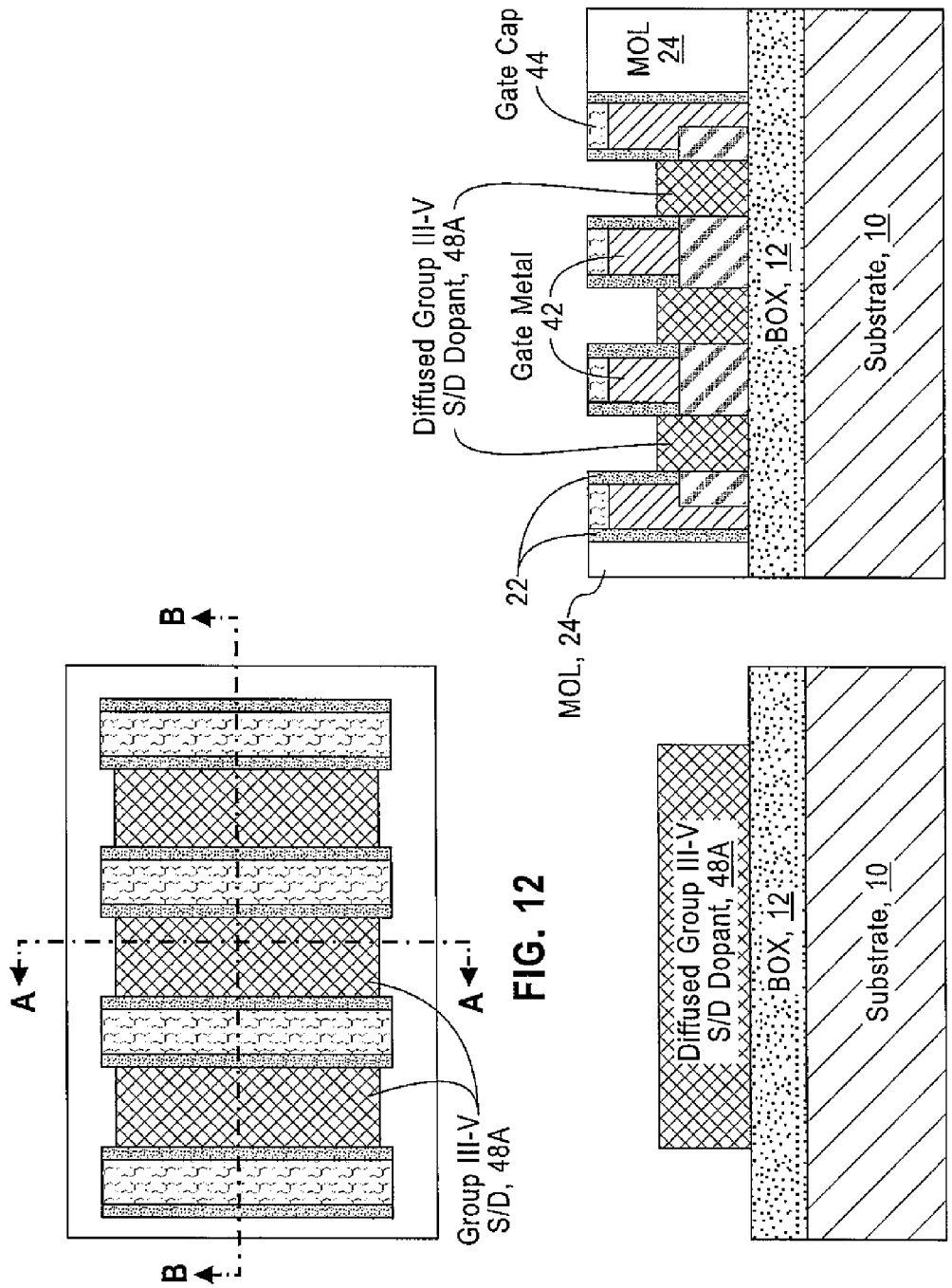

INTEGRATED CIRCUIT HAVING DUAL MATERIAL CMOS INTEGRATION AND METHOD TO FABRICATE SAME

TECHNICAL FIELD

The various embodiments of this invention relate generally to semiconductor devices and fabrication techniques and, more specifically, relate to the fabrication of semiconductor transistor devices.

BACKGROUND

It is known that a nanowire of a Group III-V semiconductor material can be grown on a substrate of Si (111) or other crystal orientation with an opening perpendicular to a seed opening. It would be desirable to grow the Group III-V material after CMOS processing so that formation of certain transistors such as PFETs can use a high temperature process.

Prior to this invention this and other needs were not met.

SUMMARY

In a first aspect thereof the embodiments of this invention provide a method that comprises providing a substrate having a surface that supports a plurality of fins comprised of Group IVA-based crystalline semiconductor material. The plurality of fins are spaced apart and generally parallel to one another. The method further comprises forming sacrificial gate structures on and orthogonal to the plurality of fins; for a first sub-set of the plurality of fins, forming PFET source/drains and performing a PFET source/drain anneal at a first temperature; for a second sub-set of the plurality of fins, forming an amorphized portion of the fins between two adjacent sacrificial gate structures; forming a dielectric layer that covers the fins between the sacrificial gate structures; removing the sacrificial gate structures and removing those portions of the second sub-set of fins that are exposed by the removal of the sacrificial gate structures; etching the amorphized portion of the fins to form a void bounded on two sides by Group IVA-based crystalline semiconductor material; growing from the two sides a nanowire, the nanowire being disposed laterally to the surface of the substrate and bridging the void; forming metal gate structures where the sacrificial gate structures were removed; removing the dielectric layer covering the second sub-set of fins; and forming over portions of the nanowire NFET source/drains and performing an NFET source/drain anneal at a second temperature, where the NFET source/drains are separated by a portion of the nanowire that underlies a metal gate structure.

In another aspect thereof the embodiments of this invention provide a structure that comprises a substrate having a surface and a plurality of fins supported by the surface of the substrate. The plurality of fins are comprised of Group IVA-based crystalline semiconductor material and are spaced apart and generally parallel to one another. In the structure at least some of the plurality of fins comprise an amorphous region forming a nanowire precursor structure that is located along a length of the fin where a Group III-V transistor is to be located.

In a further aspect thereof the embodiments of this invention provide a structure that comprises a substrate having a surface and a plurality of fins supported by the surface of the substrate. The plurality of fins are comprised of Group IVA-based crystalline semiconductor material and are spaced apart and generally parallel to one another. The structure further comprises a plurality of sacrificial gate structures that overlie the plurality of fins and that are disposed orthogonally to the plurality of fins. In the structure at least some of the plurality of fins comprise a removed region disposed between two adjacent sacrificial gate structures, where the removed region contains a Group III-V nanowire structure having a centrally located portion wherein two Group III-V material growth fronts meet.

BRIEF DESCRIPTION OF THE SEVERAL VIEWS OF THE DRAWINGS

FIGS. 1 and 1A, collectively referred to as FIG. 1, show an enlarged top view and an enlarged cross-sectional view, respectively, of a plurality of Fins disposed on a top surface of an initial structure.

Figure 13:
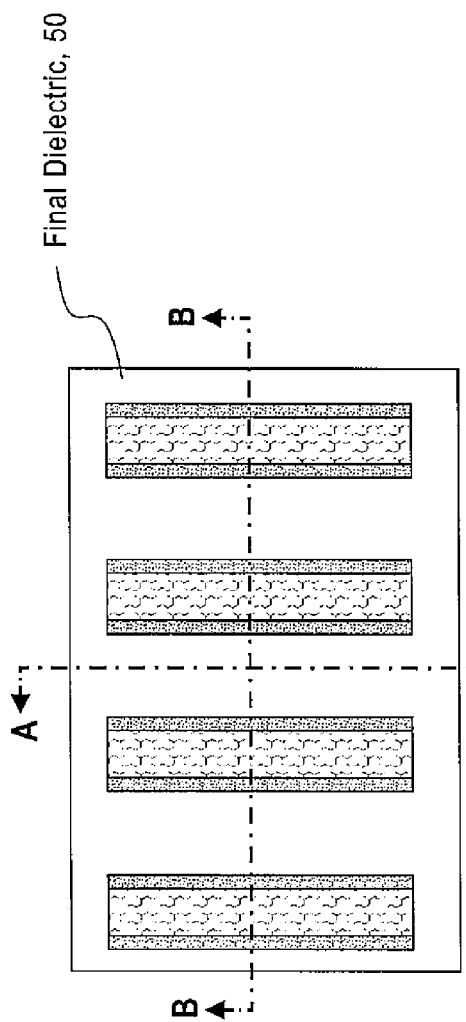
Figure 13A:
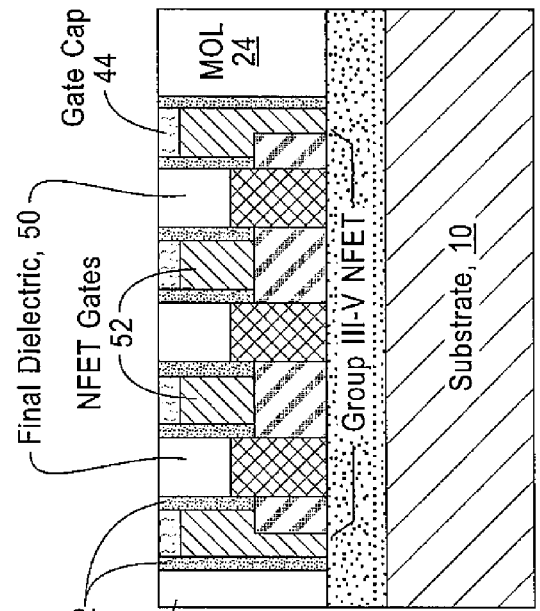
Figure 13B:
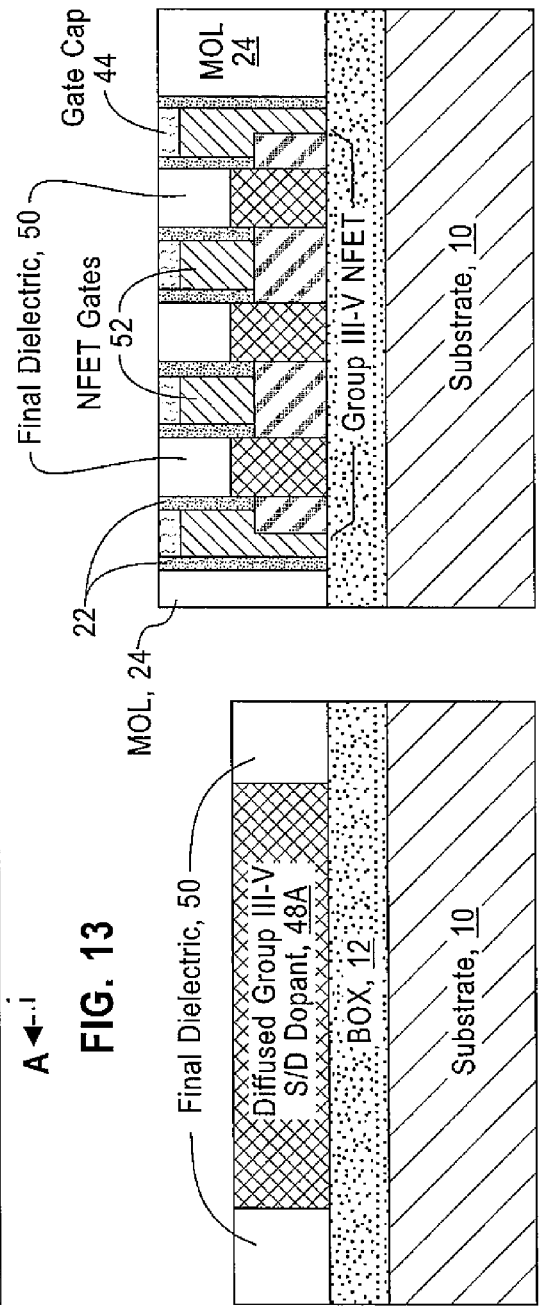

In each of FIGS. 2-13 three views are shown, where the first view is an enlarged top view, the second view (labeled A) is an enlarged cross-sectional view taken along the section line labeled "A" in the first view, and the third view (labeled B) is an enlarged cross-sectional view taken along the section line labeled "B" in the first view. The various dimensions, layer thicknesses and the like are not drawn to scale. More specifically, FIGS. 2, 2A and 2B, collectively referred to as FIG. 2, show the structure of FIG. 1 after formation of sacrificial gate structures;

FIGS. 3, 3A and 3B, collectively referred to as FIG. 3, show the structure of FIG. 2 after masking and implanting the Fins on one side of the dummy gate structure to form an amorphized (a-Si) fin region;

FIGS. 4, 4A and 4B, collectively referred to as FIG. 4, show the structure of FIG. 3 after deposition of a dielectric layer (a MOL dielectric layer);

FIGS. 5, 5A and 5B, collectively referred to as FIG. 5, show the structure of FIG. 4 after removal of the dummy gates and those portions of the Fins exposed by the removal of the dummy gates;

FIGS. 6, 6A and 6B, collectively referred to as FIG. 6, show the structure of FIG. 5 after an isotropic wet etch to remove the a-Si Fin region and form a void;

FIGS. 7, 7A and 7B, collectively referred to as FIG. 7, show the structure of FIG. 6 after a wet etch to undercut the Si forming undercut regions adjacent to the void formed in FIG. 6 and leaving remaining crystalline Si regions;

FIGS. 8, 8A and 8B, collectively referred to as FIG. 8, show the structure of FIG. 7 after a regrowth process to form a laterally disposed Group III-V nanowire grown from the remaining crystalline Si regions;

FIGS. 9, 9A and 9B, collectively referred to as FIG. 9, show the structure of FIG. 8 after replacement of the dummy gate with a functional (metal) NFET gate structure/stack;

FIGS. 10, 10A and 10B, collectively referred to as FIG. 10, show the structure of FIG. 9 after stripping the MOL dielectric only between the NFET gates and the removal the previously retained crystalline Si that formed growth fronts for the Group III-V nanowire;

FIGS. 11, 11A and 11B, collectively referred to as FIG. 11, show the structure of FIG. 10 after growing doped Group III-V source/drains;

FIGS. 12, 12A and 12B, collectively referred to as FIG. 12, show the structure of FIG. 11 after annealing the doped Group III-V source/drains; and FIGS. 13, 13A and 13B, collectively referred to as FIG. 13, show the structure of FIG. 12 after re-depositing contact dielectric followed by contact and back end metal processing for CMOS PFETs and Group III-V NFETs.

DETAILED DESCRIPTION

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatuses that are suitable for use in implementing the embodiments of this invention include, but are not limited to, rapid thermal chemical vapor deposition (RTCVD), low-energy plasma deposition (LEPD), ultra-high vacuum chemical vapor deposition (UHVCVD), atmospheric pressure chemical vapor deposition (APCVD), molecular beam epitaxy (MBE) and chemical vapor deposition (CVD). The temperature for an epitaxial deposition process typically ranges from about 550° C. to about 900° C. Although higher temperature will typically result in faster deposition of the semiconductor material, the faster deposition may also result in crystal defects and film cracking.

As employed herein an anisotropic etch process can be considered as a material removal process in which the etch rate in the direction normal to the surface to be etched is greater than in the direction parallel to the surface to be etched. The anisotropic etch may include reactive-ion etching (RIE). Other examples of anisotropic etching include ion beam etching, plasma etching or laser ablation.

As employed herein an isotropic etch process can be considered as a material removal process in which the etch rate is substantially uniform in the vertical and the horizontal directions.

As employed herein the term "Group III-V semiconductor" denotes a semiconductor material that includes at least one element from Group III of the Periodic Table of Elements and at least one element from Group V of the Periodic Table of Elements. Typically, the III-V compound semiconductors are binary, ternary or quaternary alloys including Ill/V elements. Non-limiting examples of Ill-V compound semiconductors that can be used in the present invention include, but are not limited to alloys of gallium arsenic (GaAs), aluminum arsenic (AlAs), indium gallium arsenic (InGaAs), indium aluminum arsenic (InAlAs), indium aluminum arsenic antimony (InAlAsSb), indium aluminum arsenic phosphorus (InAlAsP), indium gallium arsenic phosphorus (InGaAsP) and combinations thereof.

As employed herein the term "Group IVA semiconductor" or more simply a "Group IV semiconductor" denotes a semiconductor material that includes at least one element from Group IVA of the Periodic Table of Elements, such as silicon (Si), germanium (Ge) and alloys thereof.

In at least one embodiment thereof this invention can employ semiconductor on insulator (SOI) technology where a thin semiconductor layer such as a layer of Si or Ge is formed over an insulating layer, such as silicon oxide, which in turn is formed over a (bulk) substrate, such as a Si substrate. The insulating layer can be referred to as a buried oxide (BOX) layer or simply as a BOX. For a single BOX SOI wafer the thin silicon layer can be divided into active regions by shallow trench isolation (STI) which intersects the BOX and provides total isolation for active device regions formed in the thin Si layer (in the SOI layer). Sources and drains of field effect transistors (FETs) are formed, for example, by ion implantation of N-type and P-type dopant material into the thin Si layer and/or by the formation of raised source/drain (RSD) structures. A FET channel region between a source/drain pair can be created so as to underlie a gate structure.

It is pointed out that while certain aspects and embodiments of this invention can be employed with SOI substrates, and are described as such below, the invention can also be realized using bulk (e.g., Si or Ge or SiGe) substrates.

It is also pointed out that while a nanowire that is fabricated as described below can be grown from Group III-V material, other semiconductor materials such as Group II-VI and Group IV can also be used to form the nanowire.

The exemplary embodiments of this invention enable the growth of a Group III-V nanowire after a replacement metal gate (RMG) process to enhance the processing of the Group III-V nanowire into a transistor device, such as a NFET transistor device. While the various embodiments of this invention will be described in the context of the use of Group III-V and Si materials (such as for the Fins 14), the embodiments can be used with any combination of PFET/NFET materials including, for example, Group II-VI semiconductor materials and Group IV materials. The embodiments of this invention apply as well to devices comprised of a SiGe alloy and Ge. The embodiments apply to, for example, FinFET, nanowire and stacked nanowire instantiations of transistor devices.

FIGS. 1 and 1A show a top view and a cross-sectional view, respectively, of a plurality of Fins 14 disposed on a top surface of an initial structure comprised of a substrate 10 (e.g., a Si substrate) having an overlying BOX 12 and an overlying semiconductor layer (e.g., a Group IVA semiconductor layer comprised of Si, or Ge, or a SiGe alloy) from which the Fins 14 are formed by patterning and etching. In another, non-SOI, embodiment the Fins 14 could be disposed on a surface of a bulk substrate (e.g., a Group IVA substrate). The Fin height can be about, for example, in a range of about 30 nm to about 70 nm with 50 nm being one suitable and non-limiting value, and the Fin width can be in a range of about 3 nm to about 10 nm. The Fins 14 can have any desired length. The Fins 14 are spaced apart from one another and are generally parallel to one another.

Although an SOI substrate is used in the illustration, it is also possible to start from a bulk substrate and generate the isolation layer 12 afterwards. In addition, FINs 14 can also be formed on other semiconductors beside group IV.

FIG. 1A is a view taken along the section line A-A of FIG. 1.

In practice there will be a plurality of Fins 14 that can be partitioned into two sub-sets of Fins, where a first sub-set of the Fins is used to fabricate PFETs (e.g., CMOS PFETs) and where the second sub-set of the Fins is used, in accordance with non-limiting aspects of this invention, to fabricate Group III-V NFETs.

FIGS. 2, 2A and 2B show the structure of FIGS. 1 and 1A after formation of sacrificial gate structures, also referred to as dummy gates 16, over the Fins 14. FIG. 2A is a view taken along the section line A-A of FIG. 2 and FIG. 2B is a view taken along the section line B-B of FIG. 2. In the following Figures the same views will be labeled accordingly.

The dummy gate 16 could be formed of, for example, amorphous Si (a-Si) and can include a layer of a thin dummy gate oxide 18 on the bottom of dummy gate 16 (e.g., $SiO_2$) and a hardmask 20 such as a nitride. A next step forms a dielectric spacer 22 on sidewalls of the dummy gates 16. For a PFET (not shown), which is not a Group III-V material but is instead Silicon/SiGe, a next step completes all high temperature processing such as source and drain (S/D) epitaxy including any needed S/D anneals. The PFET processing, that can be conventional in nature, is not shown. It is assumed in the completed device that on the top surface of the substrate 10, and BOX 12 if present, there will be Si or SiGe PFETs and also Group III-V NFETs that are formed as described below. The PFET processing can be conventional in nature except as noted below.

FIGS. 3, 3A and 3B show the structure of FIGS. 2, 2A and 2B after masking and implanting the Fins 14 on one side of dummy gate structure 16 (source or drain) to form amorphized fin regions 14A. Argon and Xenon are two atoms that are suitable to be implanted to form the amorphized fin regions 14A in the Si or SiGe Fins 14. The amorphized fin regions 14A can be considered as nanowire precursors. An implant energy ranging from about 2 keV to about 50 keV can be used, although other energies can also be used depending on the selected implant species. A dose ranging from about 1E14 to about 1E16/cm-2 can be used, although other implant species doses can also be used.

FIGS. 4, 4A and 4B show the structure of FIGS. 3, 3A and 3B after deposition, such as by CVD, of a dielectric layer 24 (a middle of the line (MOL) layer). The MOL layer 24 could be a low deposition temperature oxide (e.g., <400° C.) or an oxide/nitride. The MOL layer 24 is then planarized to the top surfaces of the dummy gate structures which in this case exposes top surfaces of the hard masks 20 and top edges of the spacers 22.

FIGS. 5, 5A and 5B show the structure of FIGS. 4, 4A and 4B after removal of the dummy gates 16 by suitable etching process or processes (e.g., a reactive ion etch (RIE) or a wet etch) selective to the hard masks 20 and the underlying a-Si. The spacers 22 are retained during this etch. Next, those portions of the Fins 14 that were exposed by the removal of the dummy gates 16 are removed by an anisotropic RIE etch process through the windows formed after the dummy gate etching process. The exposed portions of the Fins 14 can be removed using, for example, a chlorine, a fluorine, or a bromine based RIE etch chemistry.

FIGS. 6, 6A and 6B show the structure of FIGS. 5, 5A and 5B after the use of an isotropic wet etch to remove the a-Si region 14A. A HCl vapor etch is one suitable etch that is selective to and capable of removing the a-Si. This process leaves a void 14C where the a-Si 14 was removed.

FIGS. 7, 7A and 7B show the structure of FIGS. 6, 6A and 6B after the use of an isotropic wet etch to undercut the Si forming undercut regions 14D adjacent to the void 14C. One suitable etch chemistry uses tetramethylammonium hydroxide (TMAH) or some other wet etch. The undercut etch leaves remaining portions 14E of the crystalline Si.

FIGS. 8, 8A and 8B show the structure of FIGS. 7, 7A and 7B after a regrowth process to form a laterally disposed, relative to the top surface of the Si substrate 10, Group III-V nanowire 40 that is grown from the remaining crystalline Si 14E (the crystalline Si 14E functions as a seed for the lateral Group III-V material growth). Other semiconductor materials, besides Group III-V materials such as Group IV materials can also be grown as the nanowire structure 40. MOCVD and MBE are two suitable growth techniques. The nanowire 40 could be composed of, for example, GaAs or GaAlAs as two non-limiting examples. The nanowire 40 grows in both directions from the remaining portions of the crystalline Si 14E and the growth front meets in the source/drain (S/D) region where a presence of any defects is less critical (less critical than in the channel region). The length of the nanowire 40 between the two remaining portions of the crystalline Si 14E can be, for example, in a range of about 30 nm to about 100 nm. The nanowire 40 could also be referred to as a Fin.

FIGS. 9, 9A and 9B show the structure of FIGS. 8, 8A and 8B after replacement of the dummy gate with a functional gate. This can be accomplished using conventional replacement gate techniques such as etching away the sacrificial gate material followed metal fill, work function metal and high-k (high dielectric constant) stack.

As non-limiting examples, this can be achieved by depositing a thin oxide layer (interface $SiO_2$ growth) on the nanowire 40 followed by gate dielectric deposition and gate metal deposition. For example, the gate dielectric can be formed as a layer of high dielectric constant (high-k) material comprising a dielectric metal oxide and having a dielectric constant that is greater than the dielectric constant of silicon nitride (7.5). The high-k dielectric layer may be formed by methods well known in the art including, for example, chemical vapor deposition (CVD), atomic layer deposition (ALD), molecular beam deposition (MBD), pulsed laser deposition (PLD) and liquid source misted chemical deposition (LSMCD), etc. The dielectric metal oxide comprises a metal and oxygen, and optionally nitrogen and/or silicon. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently established from about 0.5 to about 3.0 and each value of y is independently established from about 0 to about 2.0. The thickness of the high-k dielectric layer may be from about 1 nm to about 10 nm, and more preferably from about 1.5 nm to about 3 nm. The high-k dielectric layer can have an effective oxide thickness (EOT) on the order of, or less than, about him. The gate metal can be deposited directly on a top surface of the high-k dielectric layer by, for example, chemical vapor deposition (CVD), physical vapor deposition (PVD), or atomic layer deposition (ALD). As non-limiting examples the gate metal can include a metal system selected from one or more of TiN, TiC, TaN, TaC, TaSiN, HfN, W, Al and Ru, and may be selected at least in part based on the desired work function (WF) of the device (NFET or PFET), as is known.

In the illustrated and non-limiting embodiment there is formed a metal gate 42 with a cap 44 to form NFET gates 52 (also labeled as such in FIG. 13). The cap 44 can be, for example, comprised of an oxide, a nitride or an oxynitride material. The PFET gate processing, after the dummy gates are removed, is also accomplished. Note that the high temperature PFET S/D epitaxy was performed earlier (prior to the growth of the Group III-V nanowire 40).

FIGS. 10, 10A and 10B show the structure of FIGS. 9, 9A and 9B after stripping the MOL dielectric 24 only between the NFET gates 52. The underlying Si, i.e., the previously retained crystalline Si 14E that formed the growth fronts for the Group III-V nanowire 40, is then etched away. A TMAH etch can be used to remove the retained crystalline Si 14E.

FIGS. 11, 11A and 11B show the structure of FIGS. 10, 10A and 10B after growing doped Group III-V source/drains 48. The source/drains 48 may or may not merge the Fins. Suitable source/drain dopants in this case (NFET) could be, for example, Si, Se, or Ge.

FIGS. 12, 12A and 12B show the structure of FIGS. 11, 11A and 11B after annealing the doped Group III-V source/drains 48 forming annealed S/Ds 48A. Preferably the NFET S/D dopant anneal is performed at a temperature of about 500° C., thereby not adversely impacting the Group III-V nanowire structures 40. A higher temperature can also be used as long as it will not damage the semiconductor material. A millisecond(s) to seconds rapid thermal anneal (RTA) is one suitable process.

FIGS. 13, 13A and 13B show the structure of FIGS. 12, 12A and 12B after re-depositing contact dielectric (referred to for convenience as final dielectric 50), followed by conventional contact and back end metal processing to provide connections to the S/Ds and gates of the PFETs (not shown) and the gates 52 and adjacent S/Ds of the Group III-V NFETs.

Any of the structures depicted at least in FIGS. 1-12 could be considered as intermediate structures fabricated during the formation of devices on the common Si substrate that supports, for example, both CMOS PFETs and Group III-V NFETs.

As should be clear, in the embodiments of this invention the Group III-V growth and processing is performed after the majority of the high temperature Si-based processing (the Group III-V NFETs are processed subsequent to the high temperature processing step(s) used for the Si based PFETs).

It is to be understood that although the exemplary embodiments discussed above with reference to FIGS. 1-13 can be used on common variants of the FET device including, e.g., FET devices with multi-fingered FIN and/or gate structures and FET devices of varying gate width and length. Moreover, transistor devices can be connected to metalized pads or other devices by conventional ultra-large-scale integration (ULSI) metalization and lithographic techniques.

Integrated circuit dies can be fabricated with various devices such as a field-effect transistors, bipolar transistors, metal-oxide-semiconductor transistors, diodes, resistors, capacitors, inductors, etc. An integrated circuit in accordance with the present invention can be employed in applications, hardware, and/or electronic systems. Suitable hardware and systems in which such integrated circuits can be incorporated include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent semiconductor fabrication processes, including deposition processes and etching processes may be used by those skilled in the art. Further, the exemplary embodiments are not intended to be limited to only those semiconductor materials, metals, insulators, dopants, dopant concentrations, layer thicknesses and the like that were specifically disclosed above. Any and all such and similar modifications of the teachings of this invention will still fall within the scope of this invention.

What is claimed is:

1. A method comprising:
    providing a substrate having a surface that supports a plurality of fins comprised of Group IVA-based crystalline semiconductor material, the plurality of fins being spaced apart and generally parallel to one another;
    forming sacrificial gate structures on and orthogonal to the plurality of fins;
    for a first sub-set of the plurality of fins, forming PFET source/drains and performing a PFET source/drain anneal at a first temperature;
    for a second sub-set of the plurality of fins, forming an amorphized portion of the fins between two adjacent sacrificial gate structures;
    forming a dielectric layer that covers the fins between the sacrificial gate structures;
    removing the sacrificial gate structures and removing those portions of the second sub-set of fins that are exposed by the removal of the sacrificial gate structures;
    etching the amorphized portion of the fins to form a void bounded on two sides by Group IVA-based crystalline semiconductor material;
    growing from the two sides a nanowire, the nanowire being disposed laterally to the surface of the substrate and bridging the void;
    forming metal gate structures where the sacrificial gate structures were removed;
    removing the dielectric layer covering the second sub-set of fins; and
    forming over portions of the nanowire NFET source/drains and performing an NFET source/drain anneal at a second temperature, where the NFET source/drains are separated by a portion of the nanowire that underlies a metal gate structure.

2. The method of claim 1, where the nanowire is comprised of a Group III-V semiconductor material, and where first temperature is higher than the second temperature.

3. The method of claim 2, where the first temperature is about 1000° C. and where the second temperature is about 500° C.

4. The method of claim 1, where forming an amorphized portion of the fins comprises performing an ion implant to convert the Group IVA-based crystalline semiconductor material to amorphous material.

5. The method of claim 1, where a growth front of a portion of the nanowire grown from one side of the void meets a growth front of a portion of the nanowire grown from an opposite side of the void in a portion of the nanowire on which a source/drain is formed.

6. The method of claim 1, where etching the amorphized portion of the fins to form the void uses a first etch process, and further comprising using a second etch process to undercut Group IVA-based semiconductor material on both sides of the void.

7. The method as in claim 1, where forming sacrificial gate structures further comprises forming gate spacers adjacent to side surfaces of the sacrificial gate structures, where the gate spacers are retained during the step of removing the sacrificial gate structures.

8. The method as in claim 1, where removing the dielectric layer covering the second sub-set of fins further comprises etching portions of underlying fins, and where forming the NFET source/drains deposits source/drain material on the nanowire and into the etched portions of the underlying fins.

9. The method as in claim 1, further comprising depositing a layer of dielectric material over the gate metal structures and the NFET source drains and performing a back end metal process.

10. A structure, comprising:
a substrate having a surface; and
a plurality of fins supported by the surface of the substrate, the plurality of fins being comprised of Group IVA-based crystalline semiconductor material, the plurality of fins being spaced apart and generally parallel to one another; and
a plurality of sacrificial gate structures that overlie the plurality of fins and that are disposed orthogonally to the plurality of fins;
where at least some of the plurality of fins comprise a removed region disposed between two adjacent sacrificial gate structures, the removed region containing a Group III-V nanowire structure, the Group III-V nanowire structure having a centrally located portion wherein two Group III-V material growth fronts meet.

11. The structure of claim 10, where the Group III-V nanowire structure is located where a Group III-V NFET will be located.

12. The structure of claim 10, where the substrate is a semiconductor on insulator (SOI) substrate having a top layer comprised of the Group IVA-based crystalline semiconductor material.

13. The structure of claim 10, where the substrate is a bulk substrate comprised of the Group IVA-based crystalline semiconductor material.

14. The structure of claim 11, where the two Group III-V material growth fronts meet at a location that corresponds to a location where a source or a drain of the Group III-V NFET will be formed.

\* \* \* \* \*